United States Patent [19]

Coles et al.

[11] Patent Number: 5,111,333
[45] Date of Patent: May 5, 1992

[54] OPTICAL MIXER

[75] Inventors: Alistair N. Coles, Bath; David G. Cunningham, Wickwar, both of England

[73] Assignee: Hewlett-Packard Company, Palo Alto, Calif.

[21] Appl. No.: 585,685

[22] Filed: Sep. 19, 1990

[30] Foreign Application Priority Data

Sep. 20, 1989 [GB] United Kingdom ................ 8921244

[51] Int. Cl.⁵ ........................... H01S 3/10; H04B 9/00
[52] U.S. Cl. .................................... 359/333; 359/175; 359/191; 359/244; 359/344; 372/8; 372/26
[58] Field of Search ...................... 330/4.3; 372/8, 25, 372/26; 359/333, 175, 191, 244, 344

[56] References Cited

U.S. PATENT DOCUMENTS 4,364,014 12/1982 Gray .................................... 330/4.3

OTHER PUBLICATIONS

Gray et al., "Optoopic Modulated Based on Gain Saturation", IEEE J. Q. E., vol. QE-14, #11, pp. 839-900, Nov. 1978, Abstract only provided herewith.
Oberg et al., "Crosstalk Between Intensity . . . Laser Amplifier", IEEE J. Q. E., vol. 24, #1, pp. 52-59, Jan. 1988, abst. only.
Inoue, K., "Crosstalk . . . Semiconductor Laser Amplifier", J. Lightwave Technol., vol. 7, #7, pp. 1118-1124, Jul. 1989, abst. only.

Primary Examiner—Nelson Moskowitz
Attorney, Agent, or Firm—Woodcock Washburn Kurtz Mackiewicz & Norris

[57] ABSTRACT

An optical mixer is provided for up/down-converting a first intensity-modulated optical signal (S1), the mixer comprising an optical amplifier (20) and gain-modulating means (23) for modulating the gain of the optical amplifier. The gain-modulating means (23) comprises means for generating a second intensity-modulated optical signal (S2) and launching it into the optical amplifier (20) at an intensity to cause the amplifier to operate at least partially within its saturated gain region. This causes the gain of the amplifier to be modulated at the frequency of modulation of the second optical signal (S2).

6 Claims, 3 Drawing Sheets

OPTICAL MIXER

FIELD OF THE INVENTION

The present invention relates to the field of optical devices. More particularly, the present invention relates to an optical mixer for up/down-converting an intensity-modulated optical signal.
2.

BACKGROUND OF THE INVENTION

Subcarrier multiplexing (SCM) of an optical carrier has been proposed as an alternative to time division multiplexing in multiple access lightwave systems (T.E. Darcie, Subcarrier Multiplexing for Multiple Access Lightwave Networks, J. Lightwave Technology, 1987, LT-5, pp. 1103-1110). In a SCM scheme, an optical carrier is intensity modulated by one or more subcarriers at microwave frequencies, each of which provides an information channel.

A typical receiver configuration for a SCM system is shown in FIG. 1. A photodetector 10 (typically a pin diode) detects all the subcarrier channels, but only the required channel need be demodulated. The receiver sensitivity is determined by the detector electronic bandwidth and the bandwidth of individual channels. A microwave preamplifier 11 amplifies the subcarrier channel of interest prior to downconversion in a mixer 12 fed by a local oscillator 13. A disadvantage with this configuration is that the noise figure of available preamplifiers 11 increases as the operating frequency increases, and the receiver sensitivity decreases correspondingly.

An alternative detection technique has been proposed (T.E. Darcie et al., Optical Mixer Preamplifier for Lightwave Subcarrier Systems, Electronic Letters, 1988, Vol. 24, pp. 179-180), in which the subcarrier signals are downconverted optically by an optical mixer 15, before photodetection. See FIG. 2. The downconverted optical signals are then detected using a low speed photodetector 16 and preamplifier 17. In this proposed configuration, the optical mixer is constituted by a semiconductor optical amplifier 15, the gain of which is modulated by applying modulated electrical bias current to the amplifier 15 from a local oscillator 18. An incoming intensity modulated (IM) optical signal propagating through the amplifier interacts with the modulated gain to produce frequency shifted components of the intensity modulation signal. The optical mixer thus depends on the fact that the gain of the semiconductor optical amplifier used is dependent on the bias current applied. However, a drawback of this arrangement is that the maximum frequency at which gain modulation can be achieved is limited by the carrier lifetime of the semiconductor optical amplifier 15, as is illustrated by line A of the gain-modulation/modulation-frequency graph shown in FIG. 4.

Accordingly, an object of the present invention is to provide an optical mixer capable of operating at frequencies well into the microwave range. A further object of the invention is to provide such an optical mixer in an optical receiving system, thereby eliminating the need for high frequency preamplifiers and there associated high noise figures. A still further object of the present invention is to provide a high sensitivity optical receiver. The present invention achieves these goals.

SUMMARY OF THE INVENTION

According to the present invention, an optical mixer for up/down-converting a first intensity-modulated optical signal comprises an optical amplifier and gain-modulating means for modulating the gain of the optical amplifier. The gain-modulating means includes means for generating a second intensity-modulated optical signal and launching it into the optical amplifier at an intensity to cause the amplifier to operate at least partially within its saturated gain region. This causes the gain of the amplifier to be modulated at the frequency of modulation of the second optical signal, and harmonics thereof.

The present invention thus relies on the gain saturation properties of optical amplifiers (including, but not limited to, semiconductor optical amplifiers) to produce gain modulation. The optical mixer of the invention can be used in many applications where up/down-conversion of intensity-modulated optical signals is required, and is not restricted to SCM systems.

DETAILED DESCRIPTION OF THE PREFERRED EMBODIMENTS

Figure 1:
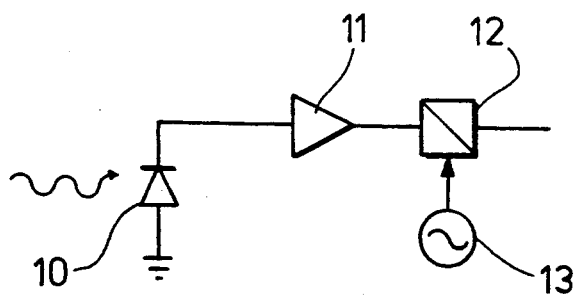
FIG. 1 is a block diagram of a first known receiver for SCM optical signals in which signal downconversion is carried out after optical detection.
Figure 2:
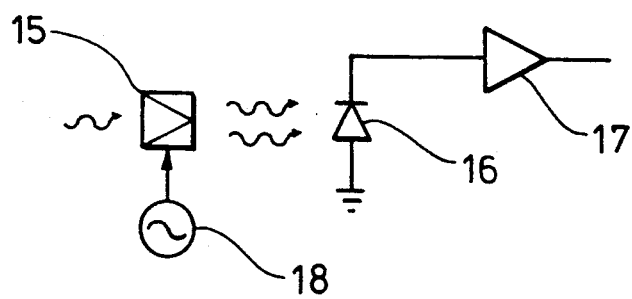
FIG. 2 is a block diagram of a second known receiver for SCM optical signals in which an incoming optical signal is optically downconverted prior to detection by means of an electrically-modulated optical amplifier.
Figure 3:
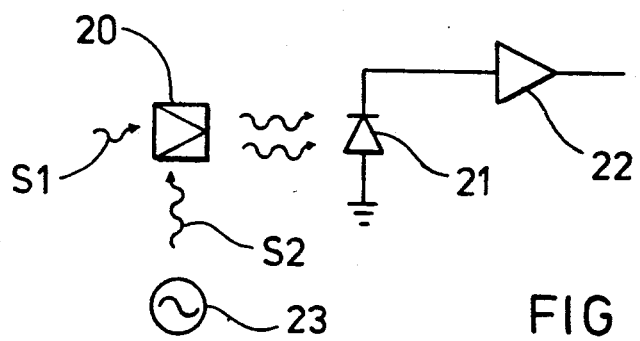
FIG. 3 is a block diagram of an optical receiver in accordance with the present invention.

Referring now to FIG. 3, an SCM receiver according to the present invention comprises an optical mixer 20, 23 arranged to optically downconvert an incoming SCM optical signal prior to detection by a photodetector 21 and amplification by pre-amplifier 22. The optical mixer includes an optical amplifier 20, the gain of which is modulated by the technique described below.

Figure 5:
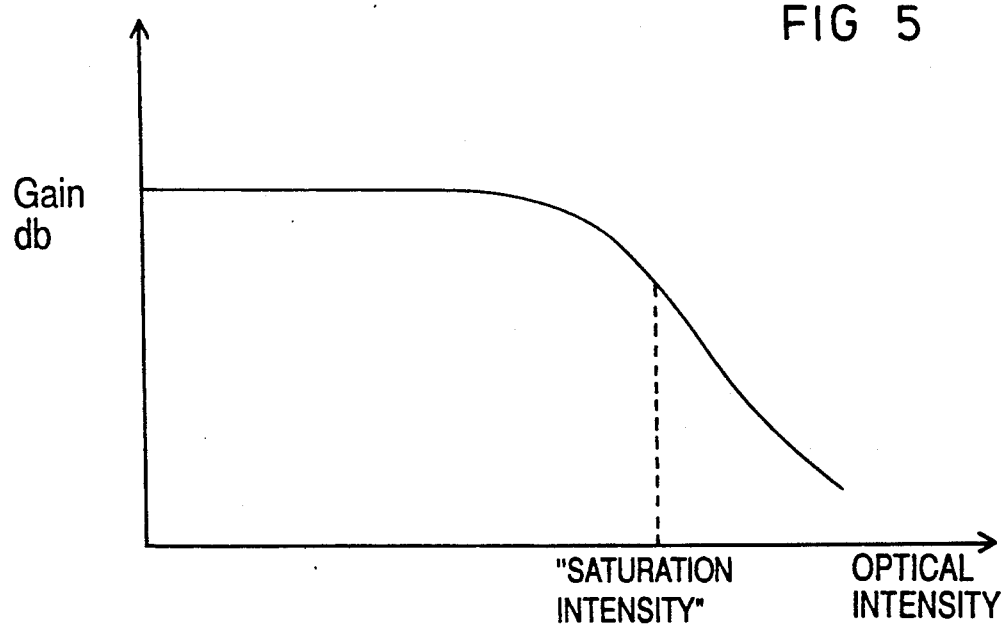
FIG. 5 is a graph showing the gain-output power characteristic of a typical optical amplifier.

The optical amplifier 20 exhibits gain saturation as the output optical intensity increases beyond a certain level (see, for example, K. Inoue et al, *Gain Saturation Dependance on Signal Wavelength in a Travelling Wave Semiconductor Laser Amplifier*, Electronics Letters, 1987, Vol. 23, pp.328-329; and also M.J. O'Mahonay, *Semiconductor Laser Optical Amplifiers for Use in Future Fiber Systems*, J. Lightwave Technology, Vol. 6,1988, pp. 531-544). FIG. 5 illustrates this gain saturation phenomenon. The "saturation intensity" is defined as the output intensity at which the gain is 3 dB less than the unsaturated gain. Thus an unsaturated gain region may be defined for output intensities less than the saturation intensity, and a saturated gain region may be defined for output intensities greater than the saturation intensity.

The gain of the optical amplifier 20 is modulated by an optical signal S2 that is intensity modulated such that the amplifier operates either wholly or partly within the saturated gain region. Any intensity modulated optical signals in the unsaturated gain region will then mix with the modulated gain to produce frequency shifted output components of the intensity modulation signal.

For example, if the gain of the optical amplifier 20 were modulated such that $$G(t) = G(1 + a\cos(w1t)),$$

where "G(t)" is the gain at time t, "G" is the gain with zero modulation, "a" is a constant, and "w1" is the modulation frequency, and an incoming intensity-modulated optical signal of the form:

$$S1 = Pi(t) = P(1 + b\cos(w2t))$$

where "Pi(t)" is signal power at time t, "P" is the mean signal power, "b" is a constant, and "w2" is the frequency of intensity modulation, then the output signal would be:

$$Po(t) = PG(1 + a\cos(w1t))(1 + b\cos(w2t))$$

where "Po(t)" is the output power at time t. The frequency spectrum of the intensity modulation of the output optical signal would then consist of components at w1, w2, (w1+w2) and (w1−w2).

Figure 4:
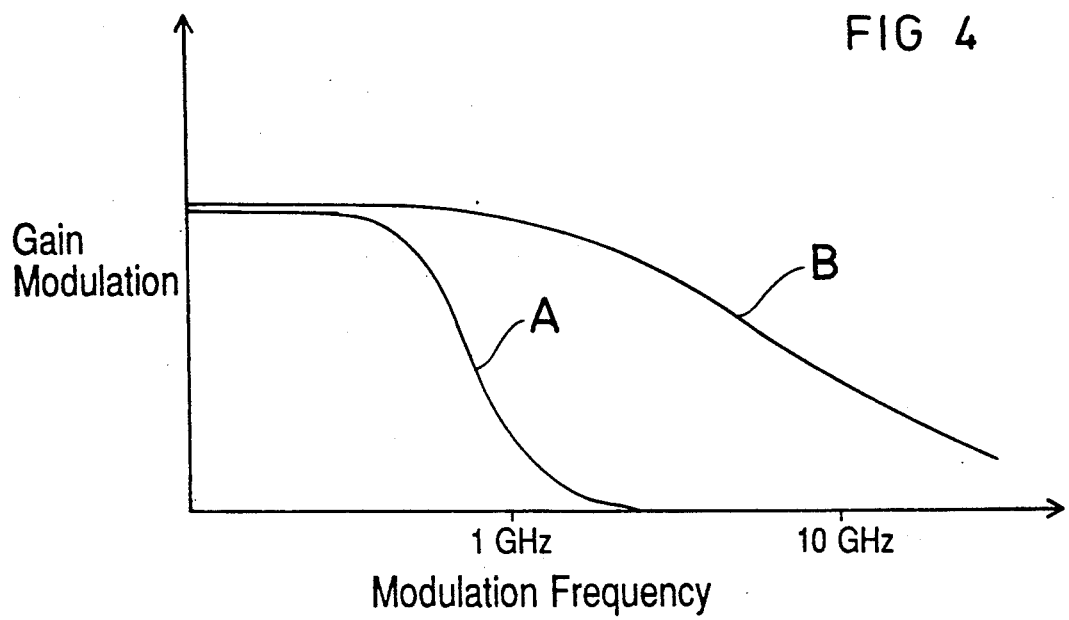
FIG. 4 is a graph showing the drop off in gain modulation with frequency for the optical mixers of the second and third receiver.

The gain-modulation drop off with frequency of such optically-modulated optical amplifiers is less severe than is the case with bias-current modulated amplifiers, as is illustrated by line B of FIG. 4.

Returning now to a consideration of FIG. 3, the optical amplifier 20 is preferably constituted by a resonant near travelling wave or travelling wave optical amplifier with suitable gain saturation characteristics. A steady state pumping mechanism (nuclear, chemical, electrical or optical) is applied to the optical amplifier to establish a suitable steady state gain (e.g., in the case of a semiconductor optical amplifier this would be a dc electrical bias current). An intensity-modulated optical signal S2 is generated by any suitable means 23 (effectively acting as a local oscillator) and is launched into the optical amplifier 20 at a suitable intensity to achieve the desired gain modulation. The incoming signal SI to be mixed is also launched into the amplifier 20. The frequency of intensity modulation of the local oscillator may be varied to tune the mixer.

Optical mixers 20, 23 of the form illustrated in FIG. 3 may be used generally to downconvert (or upconvert) intensity modulated optical signals. Downconversion of intensity modulated signals at microwave frequencies prior to photodetection allows the use of lower speed photodetectors and electronic circuitry in optical receivers. Possible applications are wideband spectrum analyzers and communication receivers.

As an upconverter the mixer may be used to frequency shift subcarriers in a subcarrier multiplexed lightwave system.

Figure 3A:
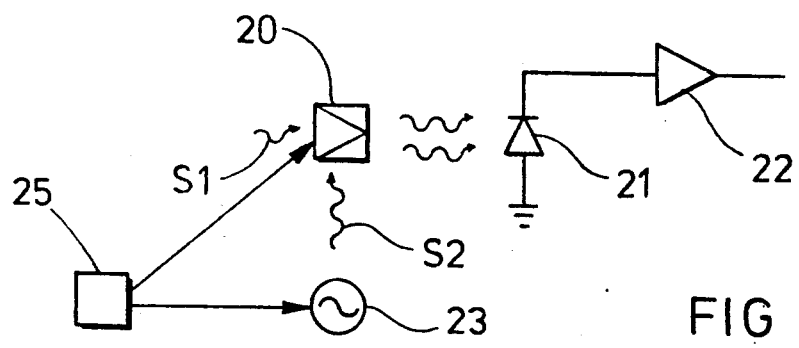
FIG. 3(A) is a block diagram of an alternative embodiment of an optical receiver in accordance with the present invention.

As shown in FIG. 3(A), the optical gain-modulation of a semiconductor optical amplifier may be combined with electrical gain-modulation effected by modulation of the amplifier bias current. The optical and electrical modulations would, of course, be correlated with each other. Block 25 of FIG. 3(A) represents, e.g., a programmable signal source. In such an arrangement, the desired down or up conversion would be partially accomplished by modulating the bias (and therefore the gain) of optical amplifier 20 electrically, with signal source 25, and partially by modulating the gain optically, as described above. The modulation frequency of S2 is selected to complement the electrical modulation. This embodiment, however, is exemplary only, as the precise relationship between the modulation frequencies of 20 and 23 will depend upon overall system requirements.

Although a particular embodiment of the invention has been shown and described and a modification has been suggested, other embodiments and modifications will occur to those skilled in the art which will fall within the true spirit and scope of the invention as set forth in the appended claims.

What is claimed is:

1. An optical mixer for up/down-converting a sub-carrier signal of a first frequency, that is intensity-modulated onto a first optical signal, said optical mixer comprising:
   (a) an optical amplifier; and
   (b) gain-modulating means, optically coupled to the optical amplifier, for modulating the gain of the optical amplifier, said gain-modulating means comprising means for generating a second optical signal intensity-modulated at a second frequency and launching said second optical signal into said optical amplifier at an intensity sufficient to cause the optical amplifier to operate at least partially within its saturated gain region, thereby causing the gain of the optical amplifier to be modulated at said second frequency resulting in up/down conversion of said sub-carrier signal.

2. An optical mixer according to claim 1, wherein said optical amplifier comprises a semiconduction optical amplifier electrically biased by an electrical bias current modulated in correspondence with modulation of the second optical signal.

3. A receiver for receiving a sub-carrier signal, of a first frequency, that has been intensity-modulated onto a first optical signal, comprising:
   (a) an optical mixer for up/down-converting the sub-carrier signal, said optical mixer comprising:
      (i) an optical amplifier; and
      (ii) gain-modulating means, optically coupled to the optical amplifier, for modulating the gain of the optical amplifier, said gain-modulating means comprising means for generating a second optical signal intensity modulated at a second frequency and launching it into the optical amplifier at an intensity sufficient to cause the optical amplifier to operate at least partially within its saturated gain region, thereby causing the gain of the optical amplifier to be modulated at said second frequency, and causing the optical amplifier to produce an output signal comprising frequency-shifted sub-carrier signals;
   (b) means for detecting at least one of the frequency-shifted sub-carrier signals; and
   (c) amplifying means, coupled to the detecting means, for amplifying the detected signal.

4. A receiver for receiving a sub-carrier signal that has been intensity-modulated onto a first optical signal as recited in claim 3, wherein the optical amplifier is a semiconductor optical amplifier electrically biased by an electrical bias current modulated in correspondence with modulation of the second optical signal.

5. A method for up/down-converting a sub-carrier signal, of a first frequency, that has been intensity-modulated onto a first optical signal, said method comprising the steps of:
 (a) launching said first intensity-modulated optical signal into an optical amplifier having a saturated gain region;
 (b) generating a second optical signal intensity-modulated at a second frequency; and
 (c) launching said second intensity-modulated optical signal into the optical amplifier at an intensity sufficient to cause the optical amplifier to operate at least partially within its saturated gain region, thereby causing the gain of the optical amplifier to be modulated at said second frequency, thus producing frequency-shifted sub-carrier signals.

6. The method of claim 5 further comprising:
 electrically biasing said optical amplifier with a current modulated in correspondence with the modulation of the second intensity-modulated optical signal.

* * * * *